United States Patent
Cripe

(10) Patent No.: US 6,222,363 B1
(45) Date of Patent: Apr. 24, 2001

(54) SWITCH-MODE FLUX-GATE MAGNETOMETER

(75) Inventor: David W. Cripe, Camp Point, IL (US)

(73) Assignee: Methode Electronics, Inc., Chicago, IL (US)

( * ) Notice: Subject to any disclaimer, the term of this patent is extended or adjusted under 35 U.S.C. 154(b) by 0 days.

(21) Appl. No.: 09/226,934

(22) Filed: Jan. 8, 1999

(51) Int. Cl.[7] ................................................ G01R 33/04
(52) U.S. Cl. ........................ 324/253; 324/225; 33/361
(58) Field of Search .................................. 324/253, 244, 324/254, 225, 255; 33/361, 355 R

(56) References Cited

U.S. PATENT DOCUMENTS

| | | | |
|---|---|---|---|
| 4,896,544 | 1/1990 | Garshelis | 73/862.36 |
| 5,124,648 | * 6/1992 | Webb et al. | 324/253 |
| 5,351,555 | 10/1994 | Garshelis | 73/862 |
| 5,520,059 | 5/1996 | Garshelis | 73/862.335 |
| 5,530,349 | 6/1996 | Lopez et al. | 324/254 |
| 5,652,512 | 7/1997 | Feintuch et al. | 324/254 |
| 5,696,575 | 12/1997 | Kohnen et al. | 324/254 |

* cited by examiner

Primary Examiner—Jay Patidar
Assistant Examiner—Amber Knox

(74) Attorney, Agent, or Firm—Steven M. Evans; David L. Newman

(57) ABSTRACT

A flux gate inductor responsive to an external magnetic field produced by a rotating magnetoelastic sleeve and oscillating voltage applied to the flux gate inductor induces a field in the flux gate inductor, for inducing current flow through the flux gate inductor, which flows through a shunting resistor, creating a voltage which is triangular as a result of the inductance of the flux gate. The sum of the induced and external fields exceeds the saturation flux density of the flux gate, causing the flux gate inductance to zero. This results in a rise in the current through the flux gate inductor and a voltage spike across the shunt resistor. The spike is detected for causing a change in an inverter for producing the oscillation voltage. Meanwhile, the external magnetic field causes an asymmetry between positive, negative currents required to saturate the flux gate inductor. This asymmetry results in a departure of the oscillation voltage from a 50% duty cycle. This departure is employed when the difference between the voltage across the shunt resistor and a reference is integrated. This integrated difference is used to generate a pulse-width modulated (PWM) signal which is buffered, inverted, and low-pass filtered to produce a feedback current which is subtracted from the shunting node. This feedback current flows through the flux-gate inductors, and generates a magnetic field within the inductor to oppose the external field. The amplitude and direction of the feedback current is proportional to the amplitude and direction of the external magnetic field.

19 Claims, 8 Drawing Sheets

SWITCH-MODE FLUX-GATE MAGNETOMETER

BACKGROUND

In the control of systems having rotating drive shafts, torque and speed are the fundamental parameters of interest. Therefore, the sensing and measurement of torque in an accurate, reliable, and inexpensive manner has been an objective for decades. With the development of prototype electric power steering systems in which an electric motor driven in response to the operation of a vehicle steering wheel controls the production torque by control of the supply current thereto, the need for a torque sensing apparatus which can accurately detect a torque produced by a steering shaft has been highlighted. Although strides have been made, there remains a need for an inexpensive torque sensing device capable of continuous torque measurements over extended periods of time despite severe environments and operating conditions.

Previously, torque measurement was accomplished by contact-type sensors attached to the shaft. More recently, non-contact torque sensors of the magnetostrictive type have been developed for use with rotating shafts. For example, U.S. Pat. No. 4,896,544 to Garshelis discloses a sensor comprising a torque carrying member, with an appropriately ferromagnetic and magnetostrictive surface, two axially distinct circumferential bands within the member that are endowed with respectively symmetrical, helically directed residual stress induced magnetic anisotropy, and a magnetic discriminator device for detecting, without contacting the torque member, differences in the response of the two bands to equal, axial magnetizing forces. Most typically, magnetization and sensing are accomplished by providing a pair of excitation or magnetizing coils overlying and surrounding the bands, with the coils connected in series and driven by alternating current. Torque is sensed using a pair of oppositely connected sensing coils for measuring a difference signal resulting from the fluxes of the two bands. Unfortunately, providing sufficient space for the requisite excitation and sensing coils on and around the device on which the sensor is used has created practical problems in applications where space is at a premium. Also, such sensors appear to be impracticably expensive for use on highly cost-competitive devices such as in automotive applications.

More recently, torque transducers based on measuring the field arising from the torque induced tilting of initially circumferential remanant magnetizations have been developed which, preferably, use a think wall ring ("collar") serving as the field generating element. See, for example, U.S. Pat. No. 5,351,555 and U.S. Pat. No. 5,520,059 to Garshelis. Tensile "hoop" stress in the ring, associated with the means of its attachment to the shaft carrying the torque being measured establishes a dominant, circumferentially directed uniaxial anisotropy. Upon the application of torsional stress to the shaft, the magnetization reorients and becomes increasingly helical as torsional stress increases. The helical magnetization resulting from torsion has both a circumferential component and an axial component, the magnitude of the axial component depending entirely on the torsion. One or more magnetic field vector sensors, which may comprise flux-gate magnetometers, sense the magnitude and polarity of the field arising, as a result of the applied torque, in the space about the transducer and provides a signal output reflecting the magnitude of the torque.

Flux-gate Magnetometers are known. Such devices measure the strength of external magnetic fields by measuring changes in the inductance of a saturable-core inductor, often referred to as a flux-gate. The flux-gate inductor is driven by an alternating current signal having, for example, a sinusoidal or triangular waveform. The AC input current induces an alternating magnetic field within the flux-gate core. The input signal has sufficient amplitude such that the induced current is large enough to drive the flux-gate core into saturation with each cycle of the input waveform. External magnetic fields are detected by measuring changes to the inductance of the flux-gate coil resulting from an external magnetic field.

When the flux-gate core becomes magnetically saturated, the magnetic permeability of the core drops toward unity, and the inductance of the flux-gate coil drops to a fraction of its original value. The rapid decrease in inductance causes a corresponding drop in voltage across the flux-gate inductor. By monitoring the voltage across the flux-gate inductor, the time when the magnetic flux-density within the flux-gate core reaches saturation can be determined in relation to the alternating cycle of the input waveform.

The magnetic flux density within the flux-gate core is a function of both the induced current flowing through the flux gate inductor and any stray magnetic flux associated with the presence of an external magnetic field. Since the external magnetic field component is variable, the saturation current $I_{SAT}$ necessary to drive the flux-gate core into saturation depends on the magnitude and direction of the external magnetic field. Also, since the voltage waveform across the flux-gate inductor drops when the flux-gate core reaches saturation, the saturation current, $I_{SAT}$, which drives the flux-gate core into saturation can be determined by comparing the output voltage waveform to the input current waveform, and measuring the delay between the rise in the input current waveform and the collapse of the output voltage waveform. Based on these measured changes in the saturation current, the magnitude and direction of the external magnetic field can be derived.

Prior art flux-gate magnetometers are constant amplitude, alternating current devices. In other words, current is flowing through the flux-gate inductor throughout each cycle of the input voltage waveform. As noted, the magnitude of the saturation current is derived by monitoring the timing of the collapse of the voltage waveform across the flux-gate inductor as the flux-gate core reaches saturation. This has typically been accomplished by placing a resistor in series with the flux-gate input, and grounding the flux-gate output. The series resistance is selected to be larger than the reactance of the flux-gate inductor such that when the circuit is fed by a voltage waveform, the current through the circuit is determined mainly by the resistor rather than the inductance of the flux-gate coil. The input to the flux-gate coil is also connected to one input of a voltage comparator, which monitors the voltage across the flux-gate inductor. In this arrangement, alternating current continually flows through the resistor and flux-gate combination, and therefore, power is continually dissipated across the resistor.

The shape of the voltage across the flux-gate resembles the inductor current signal, but is advanced by 90°. In general, the magnetometer circuit is driven by a sinusoid of magnitude sufficient to drive the flux-gate into saturation each half cycle. As noted, when the current through the flux-gate reaches saturation, the inductance of the coil drops such that the voltage across the flux gate drops to 0V while the flux-gate remains saturated. However, since the flux gate is not a perfect inductor, parasitic resistance and inductance within the coil will cause the flux-gate voltage to have a slight slope while the flux-gate core is saturated, and a definite zero crossing can be ascertained. This zero crossing is detected by the comparator connected to the input of the flux-gate. From the timing of the zero crossings relative to the input signal, the magnitude of the saturation current is ascertained. The comparator output is compared to the input voltage to determine the relationship between the zero crossings and the input voltage. Since variations in the external magnetic field alter the saturation current, the drop in the voltage, and thus the zero crossings detected by the comparator, occur at different times relative to the input waveform. By comparing the comparator output signal to the input, the magnitude and direction of the external magnetic field can be derived.

Prior art flux-gate magnetometers provide linear, accurate and noise immune measure of magnetic fields. The operating characteristics of flux-gate magnetometers are favorable when compared to Hall effect and magneto-resistive devices except in their power consumption. Since the magnetometer is a constant current device, power is continually dissipated by the device. The current supplied saturates the flux-gate core; typically this is on the order of tens of milliamps. In applications where the magnetometer is battery powered, current consumption must be kept to a minimum to conserve the battery. Therefore, it is desirable to provide a magnetometer having the positive characteristics of traditional flux-gate magnetometers, including linearity, accuracy and noise immunity, while drawing a negligible current.

One magnetometer made by the assignee of the present invention excites a saturable, flux-gate with a periodic, triangular current waveform, and observes the resultant voltage across the flux-gate. Net flux within the flux-gate results in a second-harmonic of the excitation waveform. A bias-field feedback loop creates a linear and temperature resistant system.

Other designers use the second harmonic to measure magnetic fields. See U.S. Pat. No. 5,696,575 "Digital Flux Gate Magnetometer" and U.S. Pat. No. 5,652,512, "Advanced Digital Flux Gate Magnetometer"—both assigned to Hughes—are two such devices. The Hughes patents are written in the context of a three-winding flux-gate coil. U.S. Pat. No. 5,530,349 by inventors Lopez et al "Magnetic Field Sensor Device Using Flux Gate Principle" shows another device for measuring magnetic field through a second harmonic.

The present invention departs from prior art circuitry in that all signals driving the flux gate coil, and its feedback coil, are derived from digital signals, and digital gates acting as switching power supply components. This is to reduce the power dissipation within the active circuitry over prior art. Unlike the prior art Hughes patents, no digital accumulator or digital-to-analog converter is used.

SUMMARY OF THE INVENTION

The present invention is predicated on the observation that there is an asymmetry between positive and negative currents which saturate the core of a flux gate inductor, when that flux gate inductor is in the presence of an external magnetic field.

According to the present invention, a flux gate inductor is responsive to an external magnetic field produced by an adjacent magnetoelastic torquemeter. An oscillating voltage square wave is applied to the flux gate inductor coil. This induces current flow within the coil, by the formula $E=-L\, dI/dt$. Thus the current waveform within the flux gate coil is substantially a periodic triangular waveform. The current flow though the flux gate inductor is monitored by the voltage produced as it flows though a current-shunt resistor in series with the flux gate coil. As the sum of the induced (by coil current) and external fields exceeds the saturation flux density of the flux gate core material, the permeability of this core material diminishes from a large value (nominally 10,000) toward unity. This causes the inductance of the flux gate, and the voltage across it, to drop toward zero. This, in turn, results in a rise in the current through the flux gate inductor and a consequent voltage spike across the shunt resistor. The spike is detected by a comparator, for causing a change in the state of an inverter for producing the oscillation square wave mentioned above. At the same time, the external field causes an asymmetry between positive and negative currents required to saturate the flux gate inductor. This asymmetry results in a departure of the square wave from a 50% duty cycle. This departure results in the average voltage at the shunting node to depart from its nominal ½ Vdd. The difference between this voltage and a reference voltage of ½ Vdd is amplified and integrated in an op-amp circuit. This integrated difference is compared to a triangle-wave to generate a pulse-width modulated (PWM) signal. The PWM signal is buffered and inverted, and then low-pass filtered to produce a feedback current, which is subtracted from the shunting node. This feedback current flows through the flux-gate inductors, and generates a magnetic field within the inductor to oppose the external field. The feedback circuit minimizes the departure of the duty cycle of the oscillator circuit from 50%. The amplitude and direction of the feedback current is proportional to the amplitude and direction of the applied magnetic field.

A feature of the invention is that it uses a flux-gate with a single winding, allowing a compact flux-sensing arrangement. The drawback of using a flux-gate coil with a single winding is that all three functions—drive, sensing, and feedback—must be accommodated through this winding. In this configuration, the current levels required of the drive and feedback signals for these flux-gate coils preclude the use of all but a few op-amps to deliver the needed amplitude. The power dissipation within these op-amps limits their use at high external temperatures. A main feature of the present invention, in contrast, is that these high-current signals are all generated through high-efficiency switching circuitry, which greatly reduces the IC power dissipation, and reduces power consumption of the overall system. A further feature is its use of linear circuitry for error correction.

Another feature of the present invention is that all signals to the flux gate coils are generated by switch-mode amplifiers, improving the efficiency of the circuit. The output of the invented circuit is an analog signal.

Further objects, features and advantages will be apparent in light of the claims, text and accompanying drawings.

WRITTEN AND DETAILED DESCRIPTION OF THE PRESENTLY PREFERRED EMBODIMENT

Figure 1:
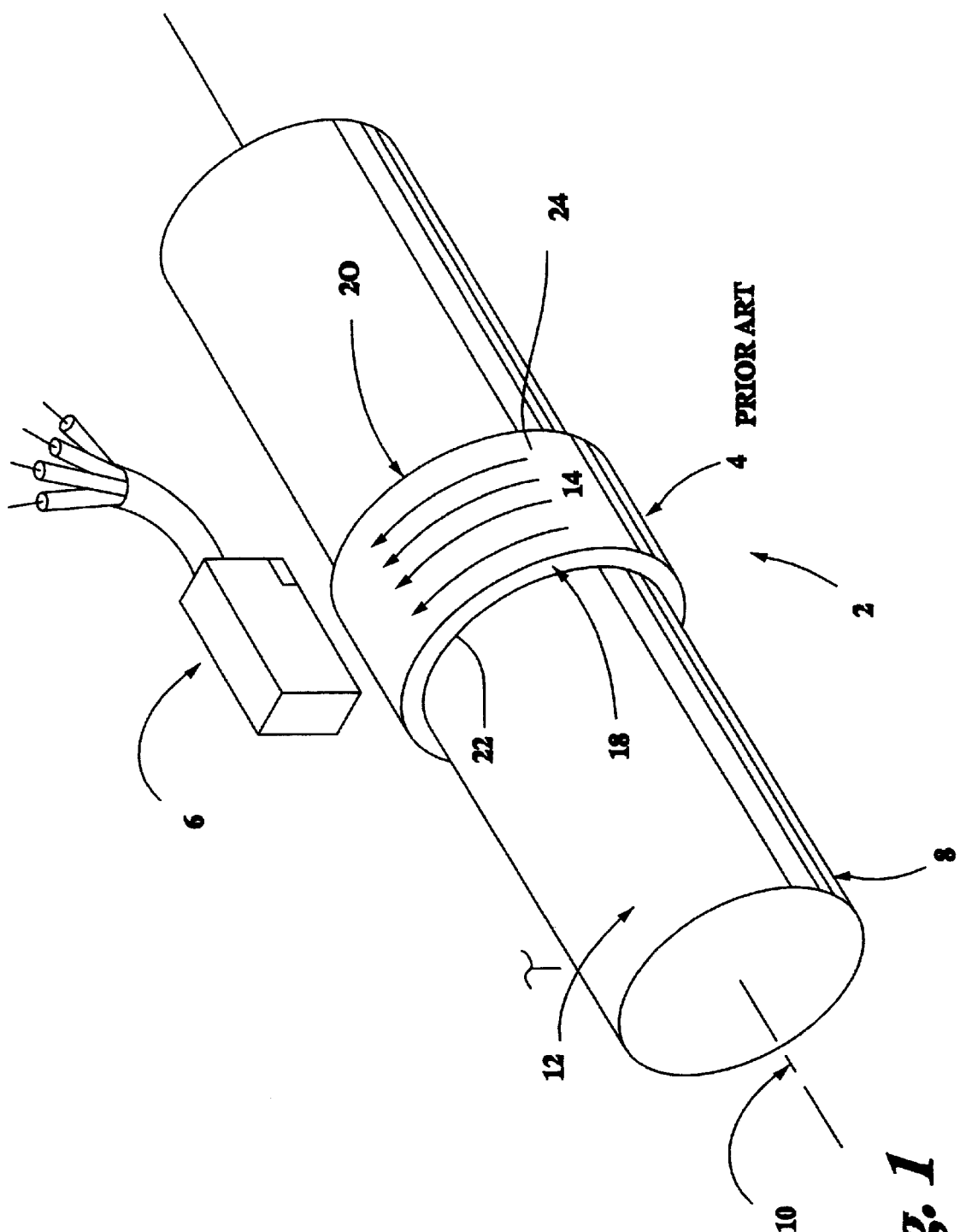
FIG. 1 is a perspective view of a prior art torque sensor capable of incorporating the flux gate magnetometer of the present invention.

Referring to FIG. 1, a torque sensor incorporating the flux-gate magnetometer of the present invention is shown generally at 2. Torque sensor 2 comprises transducer 4 and magnetic field sensor 6. Torque sensor 2 is mounted on a shaft which is part of a machine (not shown) and rotates about a central longitudinal axis 10. Torque 12 is applied at one portion of shaft 8 and is transmitted thereby to another portion of shaft 8, but can be applied in the other direction as well. Transducer 4 may take the form of a cylindrical sleeve having end faces 18 and 20, inner surface 22, and outer surface 24, attached to shaft 8 at a convenient location along axis 10 which is within an effective uniaxial magnetic anisotropy having the circumferential direction as the easy axis. In addition, transducer 4 is magnetically polarized in a circumferential direction 14, such that, in the absence of an applied torque 12 (in a quiescent state), it has no net magnetization component in the direction of axis 10 and has no net radial magnetization components. The application of torsional stress to shaft 8, and thus to transducer 4, causes reorientation of the polarized magnetization in transducer 4. The polarized magnetization becomes increasingly helical as torsional stress increases. The helicity of the magnetization in transducer 4 depends on the magnitude of the transmitted torque 12, and the chirality is dependent on the directionality of the transmitted torque and the magnetoelastic characteristics of transducer 4. The helical magnetization resulting from torsion of transducer 4 has both a circumferential component in direction 14 and an axial component along axis 10. The magnitude of the axial component depends entirely on the torsion in transducer 4 and the sensing of the magnitude of this component with a magnetic field vector sensor 6, such as flux-gate magnetometer, results in an electrical signal which is linearly indicative of the magnitude of the torque applied to the shaft.

Figure 2:
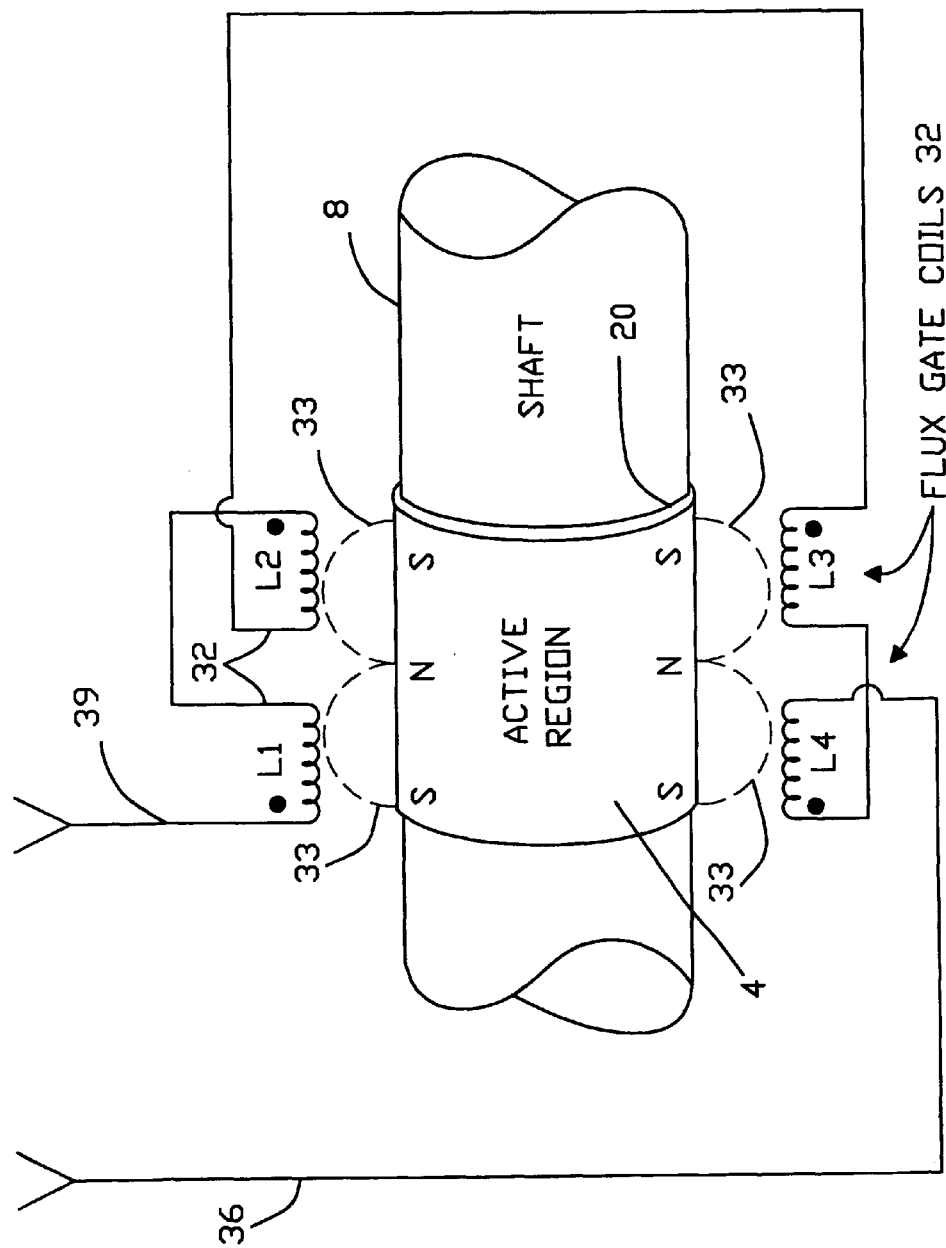
FIG. 2 is a side view of a torque sensor employing the present invention.

FIG. 2 shows transducer 4 on shaft 8 where torque sensor 6 includes four flux gate inductors 32 spaced around transducer 4 and forming a magnetic circuit via dotted flux lines 33 through the flux gate inductors 32 and the North (N) and South (S) poles of the transducer 4. A square wave voltage is applied on line 36 and a triangular current I is provided to a shunt resistor (FIG. 4) on line 39.

Figure 3:
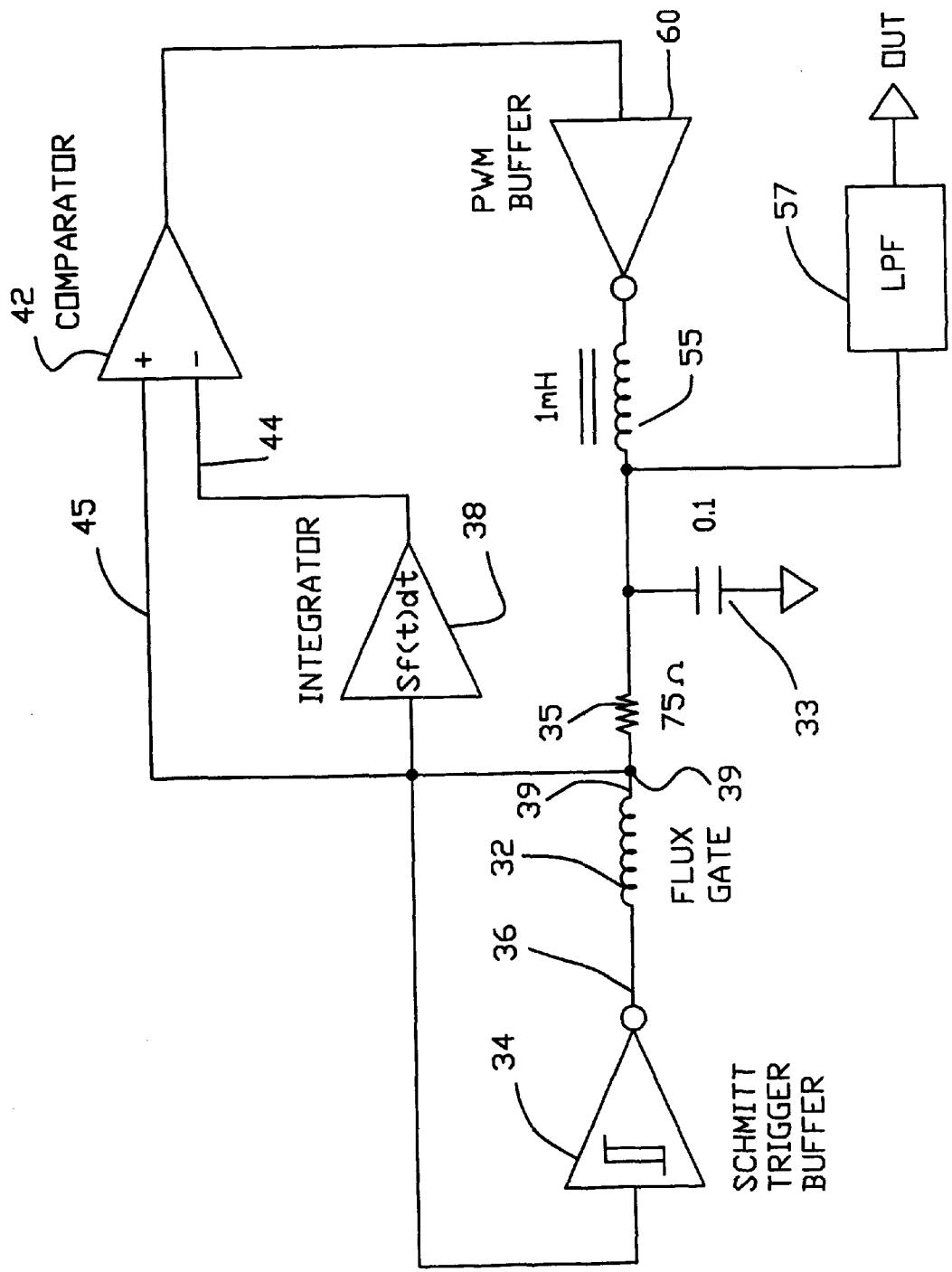
FIG. 3 is a block diagram of a flux magnetometer circuit employing the present invention.

FIG. 3 is a block diagram of the torque sensor 6 of the present invention. Flux gate inductor 32, part of torque sensor 6, is responsive to an oscillating square wave from Schmidt trigger 34 on line 36. This symmetrical square wave voltage alternates between 0V and a supply voltage $V_{DD}$. Flux-gate inductor 32 is constructed with a magnetically saturable core. The square wave voltage induces a sinusoidal current through flux-gate inductor 32 sufficient to saturate its core. A threshold saturation current $I_{SAT}$ which saturates the flux-gate core is determined by the physical construction of the flux-gate inductor and external magnetic field(s) adjacent the flux-gate coil 32. As the current through the flux-gate inductor 32 increases, the magnetic flux density within the core increases. As the magnetic flux density within the core exceeds the saturation flux-density, the relative permeability of the core drops toward unity, causing a drop in the inductance of the flux-gate coil. During saturation, the inductance of the flux-gate coil 32 is a fraction of its non-saturated value. With this drop in inductance, the rate of change in the current through the flux-gate increases radically, causing a current spike through the flux-gate 32. A corresponding spike in the output current of flux-gate 32 further charges capacitor 33.

The rate at which capacitor 33 charges is dependent, in part, on the inductance of the flux-gate coil 32. When the core reaches saturation, the voltage across shunt resistor 35 increases. This transition, however, lags the positive transition of the input signal by a measurable time delay. The length of this delay is a function of the inductance of the flux-gate coil 32 and external magnetic fields created by the magnetoelastic sleeve known as transducer 4 on rotating shaft 8.

Obviously, when no external magnetic field is present, as when no torque is applied to shaft 8, the saturation current $I_{SAT}$ required to saturate the core of flux-gate 32 in the forward equals the magnitude of the current required for saturation in the negative direction. Thus, the time required for the applied voltage to the flux gate coils to induce a ramp of current from the negative saturation current to the positive saturation current (or visa versa) is equal. This symmetry does not hold, however, once an external magnetic field is introduced.

With each half cycle of the input voltage square wave, the voltage polarity across flux-gate inductor 32 is reversed. The effect of the induced magnetic field is a change in the saturation current $I_{SAT}$ necessary to drive the flux-gate coil into saturation. Due to the directional nature of the external magnetic field, the changes to $I_{SAT}$ in the forward and reverse directions across the flux-gate inductor 32 differ. If the external field is parallel to the direction of the magnetic flux induced in the flux-gate core during the positive half cycle of the input waveform, the flux-gate core will reach saturation sooner than when no external field is present. This leads to a reduction in the saturation current in the forward direction. Conversely, in the reverse direction, a greater reverse current is necessary to overcome the opposing magnetic flux of the external field. This leads to an increase in the saturation current in the reverse direction.

Flux gate inductor 32 is responsive to the external field produced by rotating magnetoelastic sleeve 4 and oscillating voltage square wave applied to the flux gate inductor 32.

In FIG. 3, a free-running Schmitt trigger oscillator 34 provides a nominal 80 kHz square wave to the flux gate 32. This square wave voltage induces a field in the flux gate inductor 32, for providing a current through flux gate inductor 32 and then through shunt resistor 35. As will be explained with regard to FIG. 4, Schmitt trigger 34 is comprised of flux gate 32, a comparator 51, an inverter 53, and four resistors 35, 37, 43, 47. Because of the inductance of flux-gate inductor 32, the current through this inductor is triangular. As the sum of the induced and external fields exceeds the saturation flux density of the flux gate 32, its drops to zero. This results in a dramatic rise in the slope of the current passing through the flux-gate inductor 32. This causes a voltage spike on shunt resistor 35; this spike is detected in comparator 49. This causes the output of inverter 53 to change state, resulting in a continuous oscillation.

When the sum of the two fields exceeds the saturation flux density of the flux gate 32, its inductance drops to zero. This results in a rise in current through the flux gate inductor 32 and a consequent voltage spike across resistor 35 shunting flux gate 32. The spike is detected by Schmitt trigger oscillator 34 and causes a change in the state of an inverter 53 in Schmitt trigger oscillator 34 for producing the oscillation square wave mentioned above. At the same time, the external field causes asymmetry between positive and negative currents required to saturate the core flux gate inductor 32. This asymmetry results in a departure in the oscillator waveform from a 50% cycle duty square wave causing the voltage at node 39 to drop below a nominal voltage reference ½ Vdd.

The difference between the voltage across shunting resistor 35 and the reference voltage of 2.5 V is integrated 38 before it is provided to comparator 42 on line 44. Comparison 42 of the integrated difference with that triangular voltage provided on line 45 produces a pulse width modulation (PWM) signal on line 58. This pulse width is determined by the integrator voltage 54, where if the voltage 54 increases above its nominal ½ Vdd, the output of the PWM comparator is a PWM signal of less than 50% duty, and visa versa. The PWM signal is then provided through an inductor 55 back to node 41. The effect is that current from the inductor 55 into node 41 will be increased or decreased in proportion to the PWM signal, which is determined by integrator signal 54, which is in turn determined by the external magnetic field affecting flux gate 32. The voltage at node 41 is low pass filtered 57. Low-pass filter 57 further attenuates the AC component, which may be present at 41.

Figure 4:
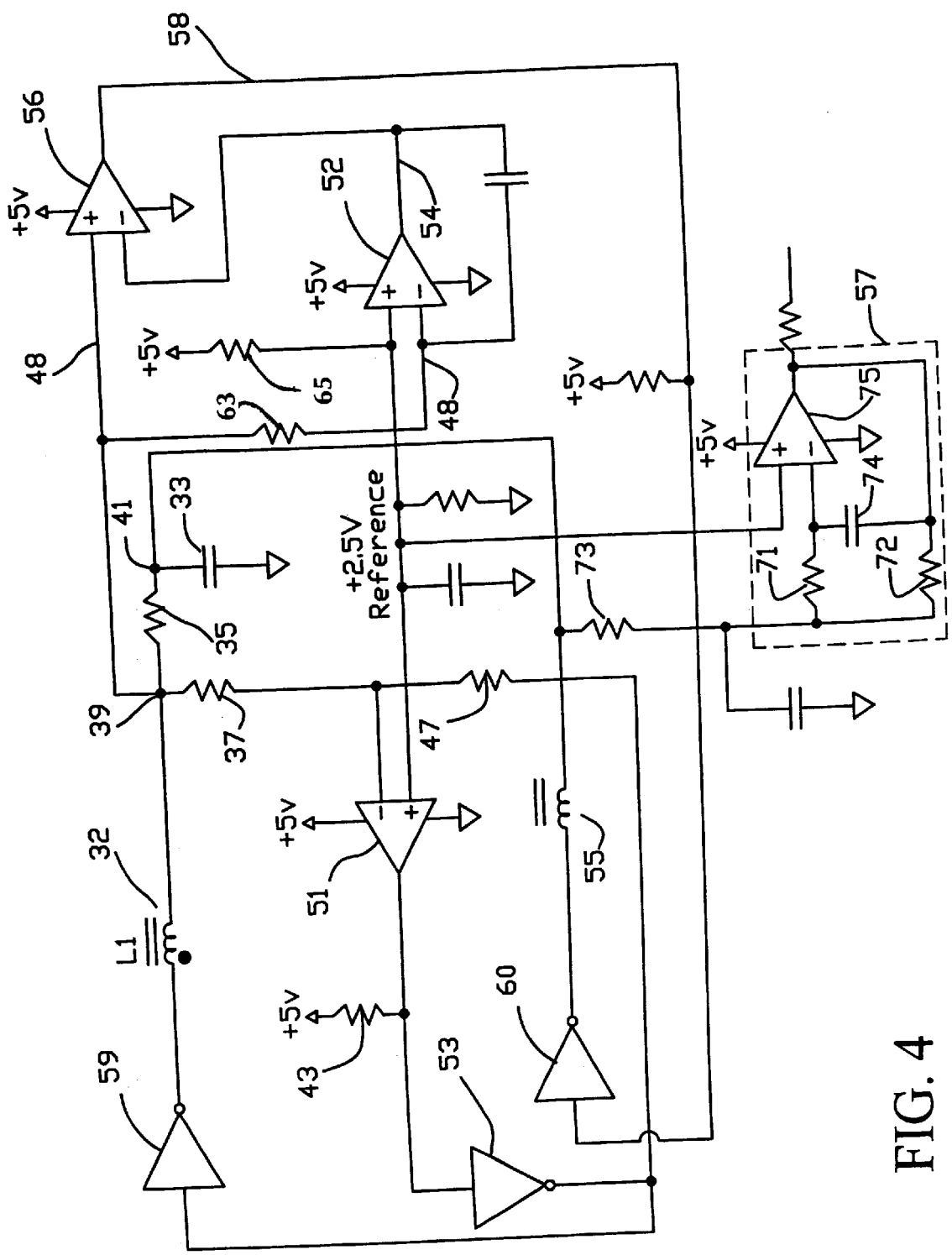
FIG. 4 is a circuit diagram of a flux magnetometer circuit according to the present invention.

FIG. 4 shows a circuit diagram of the magnetometer of the present invention. Flux gate inductor 32 is part of free-running Schmitt-trigger oscillator 34 comprised of flux gate 32, four resistors 35, 37, 43, 47, comparator 51, and inverter 53. The output of inverter 59 is an 80 kHz, rectangular, logic-level waveform. Because of the inductance of flux-gate inductor 32, the current through flux-gate inductor 32 is nominally a triangular waveform. As the sum of the induced magnetic flux, and the external magnetic field exceeds the saturation flux density for the core material of the flux gate inductor 32, its inductance drops to zero. This increases the slope of the current passing through flux-gate inductor 32. This causes a voltage spike to occur on current shunt resistor 35. This spike is detected in comparator 51. This output of comparator 51 causes the output of inverter 53 to change state, resulting in a continuous oscillation.

Specifically, this is because comparator 51, resistors 37, 49 and inverter 53 comprise a Schmitt-trigger 34 with hysteresis, so that as the voltage applied to 35 exceeds 3.3 volts, the output of the comparator changes states to a low logic state, which changes the threshold level for the comparator to 1.66 volts. As the voltage on resistor 35 drops below 1.66 volts, the state of comparator 51 changes to a logic high. In sum, the Schmitt-trigger 34, flux Gate 32, and resistor 35 act together as an LR oscillator.

Any external magnetic field will result in an asymmetry between the positive and negative currents required to saturate the flux gate inductor 32. This will alter the duty ratio of the square wave through flux gate 32, shifting the average voltage on resistor 35 away from its nominal value of 2.5 volts at node 41. The magnitude and direction of the shift will be determined by the external magnetic field incident upon flux gate 32.

Figures 5A, 5B:
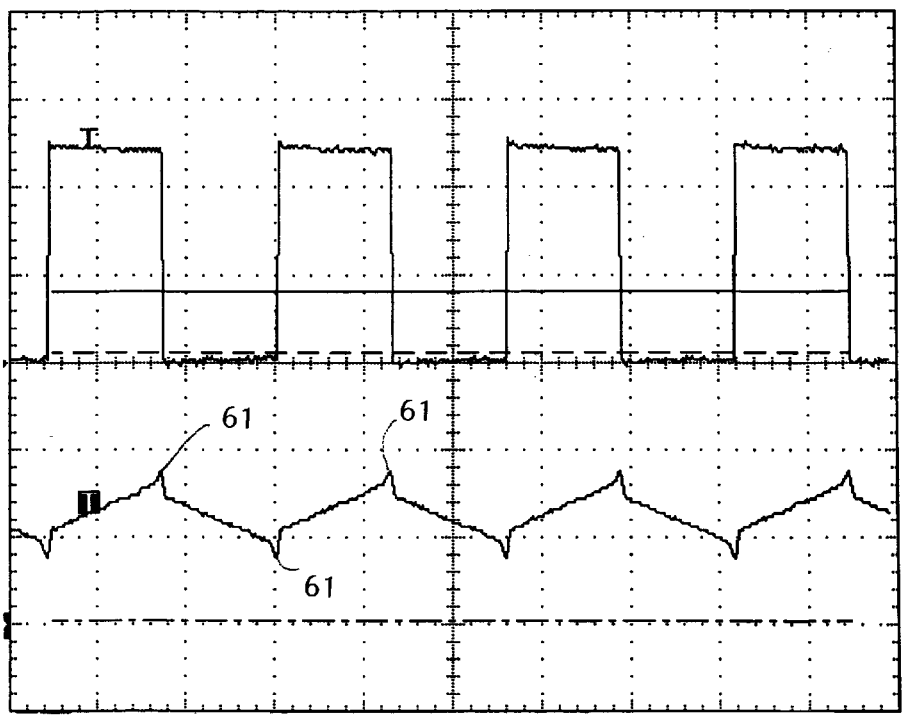
FIG. 5a is a plot of the square wave feeding flux gate 32.
FIG. 5b is a plot of the output of flux gate 32, the voltage on resistor 35, which has the same general triangular shape as the inductor current, including spikes 61 corresponding to coil saturation.

FIG. 5a is a plot of the square wave feeding flux gate 32.
FIG. 5b is a plot of the output of flux gate 32, the voltage on resistor 35, which has the same general triangular shape as the inductor current, including spikes 61 corresponding to coil saturation.

Current though flux gate 32 provides a triangle voltage waveform across resistor 35. The triangular voltage is provided on line 48 to op amp 52 at the inverting input. A 2.5 voltage reference is provided one line 50 from node 41 to a non-inverting input of op amp 52. Op amp 52, together with resistors 63, 65 and capacitor 33 function as an integrator 38 for integrating the difference between the inputs at the op amp 52, namely the difference between the triangle voltage provided by the flux gate 32, and the 2.5 voltage reference. The integrated difference is provided on line 54 to a comparator 56. Comparator 56 compares the integrated difference on line 54 and the triangle voltage signal for providing a pulse width modulation (PWM) signal on a line 58. The width of the pulses are a function of the magnitude of the integrated difference.

From the op amp 52, the PWM signal is buffered in inverter 60 and then provided to an inductor 55 and back to node 41. If a control loop is used to remove current from 33 so that the average voltage at node 41 common to flux gate 32 and shunt resistor 35 remains at 2.5 volts, then the current required to do so will be directly proportional to the amplitude and direction of the external field, as it will act to force the net magnetic field in the flux-gate 32 to zero.

From node 41, the signal is low pass filtered 57 and provided as an output indicative of the direction, magnitude of the torque on shaft 8 which produced the external magnetic field incident on flux gate 32. Low pass filter 57 removes the AC component from the PWM signal. Number of poles, cutoff frequency affects the degree of attenuation of the PWM signal.

Integrating 38 the difference between shunt resistor 35 voltage and a 2.5 V reference and comparing the integrated difference with a triangular voltage produces a pulse-width modulated signal which produces a current which is added or subtracted to zero the net flux in flux gate inductors 32. Alternately, the pulse width modulated signal at the output of can interface directly with digital control circuitry.

The average voltage of the pulse-width modulated signal is proportional to the applied external magnetic field. Low-pass filtering this signal is performed by the circuit consisting of 71, 72, 73, 74, and 75.

Figures 6A, 6B:
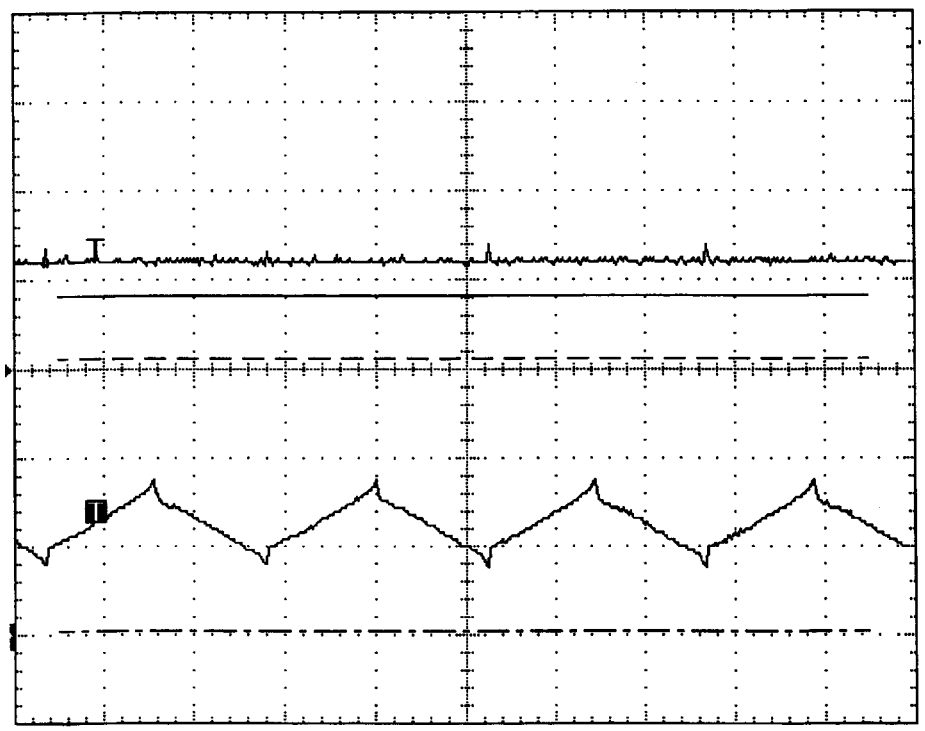
FIG. 6a is the output of an integrator, nominally 2.5 volts for a zero external magnetic field.
FIG. 6b is the shunting resistor voltage used as a triangle signal.

FIG. 6a shows the output of the integrator, which is nominally 2.5 volts for a zero external magnetic field.

FIG. 6b shows the voltage across shunt resistor 35.

Figures 7A, 7B:
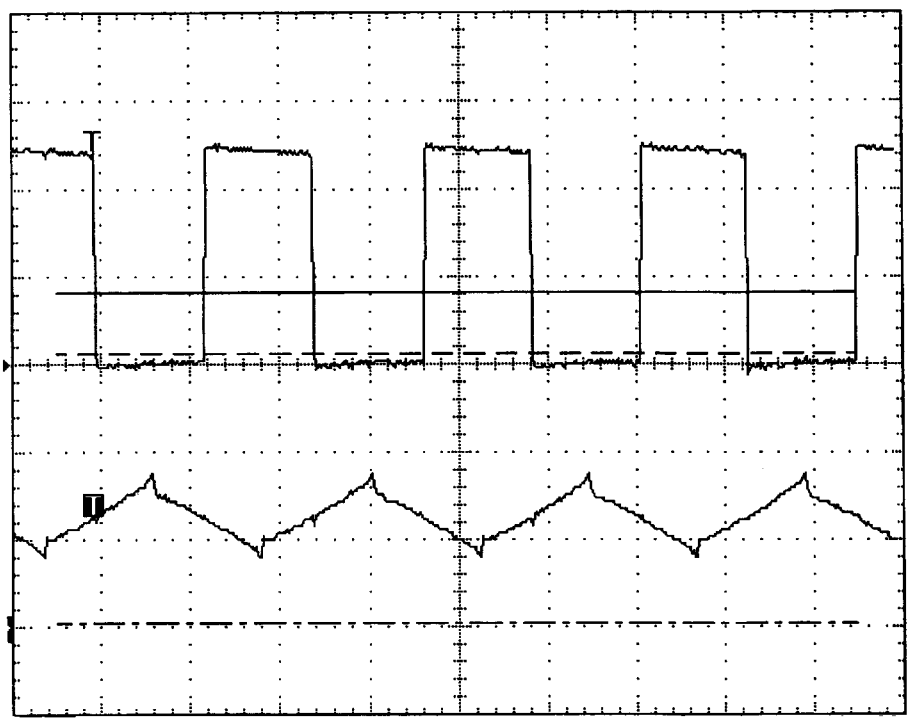
FIG. 7 shows an output of a PWM Amp generated by comparing the output of the integrator with the shunting resistor voltage.

FIG. 7 shows the output of the PWM Amp 56—driving the inductor 55. This signal is generated by comparing 56 the output of the integrator 52 with the triangular voltage (such as is already available on across shunt resistor 35).

Figure 8:
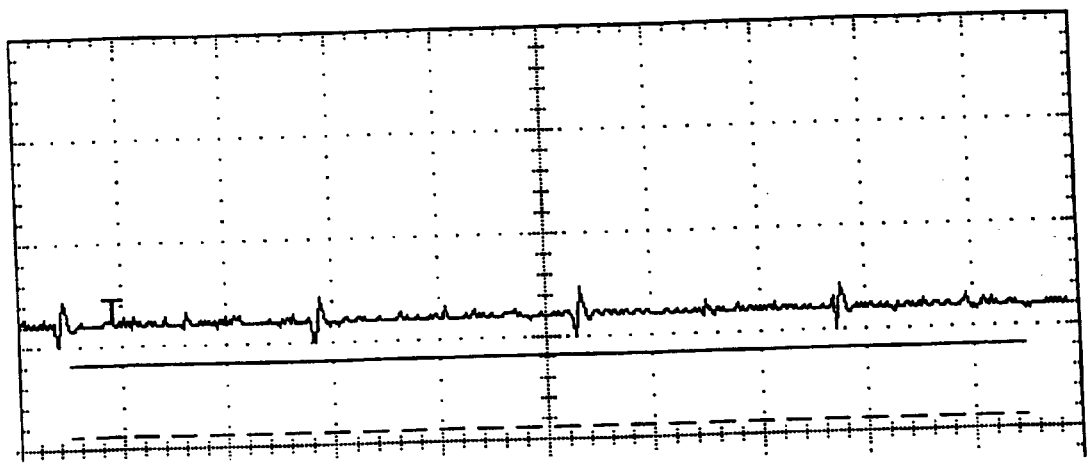
FIG. 8 shows the low-pass filtered version of the signal at C1.

FIG. 8 shows the output signal of the torque sensor 6. This is the low-pass filtered version of the signal at capacitor 33.

It should be understood that various changes and modifications to the presently preferred embodiments described herein will be apparent to those skilled in the art. Such changes and modifications may be made without departing from the spirit and scope of the present invention and without diminishing its attendant advantages. For example, integrated circuits of other logic families, or application specific integrated circuits may be substituted for those shown here. Further, addition of microprocessor and/or digital signal processing circuitry can add features such as adaptive filtering to remove periodic interfering signals, temperature compensation, peak detection, gain and offset drift correction, etc. Addition of these is not excluded by the claims.

What is claimed is:

1. A method of measuring torque on a rotating shaft, comprising the steps of:

providing a magnetic field sensor, responsive to an external magnetic field signal provided by a magnetoelastic sleeve adjacent to an inductor and an electrical oscillation source for providing an oscillating signal through said magnetic field sensor;

measuring a shunt voltage signal at a node at one end of said magnetic field sensor;

subtracting the shunt voltage from a voltage reference for providing a difference signal;

providing a pulse width modulation signal (PWM) in response to said difference signal, said PWM signal having an amplitude which is a function of said external magnetic field;

providing a current signal in response to said PWM signal; and providing said current signal to said node for adding and subtracting a current proportional to said difference signal.

2. The method of claim 1 wherein the inductor is a saturable core flux-gate inductor driven by said oscillating signal.

3. The method of claim 1 wherein the magnetic field sensor further comprises a capacitor connected to the output of the inductor for storing energy, the current signal adding and subtracting energy stored in said capacitor for zeroing net flux in said inductor.

4. The method of claim 1, wherein said oscillating signal is provided by using the shunt voltage as an input to a Schmitt trigger and an output of said Schmitt trigger as feedback to said magnetic field sensor.

5. The method of claim 1, wherein said difference signal is integrated prior to being converted into a PWM signal.

6. The method of claim 5, wherein said PWM signal is provided by comparing said integrated difference signal to a triangular signal.

7. The method of claim 5, wherein said PWM signal is provided by comparing said integrated difference signal to said shunt voltage.

8. The method of claim 1, wherein said current signal is low pass filtered.

9. A magnetometer for measuring a magnetic field, comprising:

a switching circuit driven by a periodic signal having an alternating current;

a saturable core flux-gate inductor responsive to an external magnetic field, said saturable core flux-gate inductor being periodically saturated by the alternating current;

a capacitor for receiving current from an output of the saturable core flux-gate inductor, and the capacitor is charged by inductance of the saturable core flux-gate inductor to later provide a reference voltage;

means for detecting the saturated condition of saturable core flux-gate inductor; and means for toggling of the output level of said switching circuit means when a saturated condition is detected, thereby causing the switching means, the saturable core flux gate inductor, and the means for detecting to collectively operate as a free-running oscillator for producing alternating current.

10. The magnetometer of claim 9, wherein asymmetry of flux-gate saturation currents resulting from a net magnetic field within the saturable core flux-gate inductor results in the duty of the oscillator switching waveform deviating from a nominal 50%.

11. The magnetometer of claim 9, wherein the asymmetry is detected by comparing the net oscillator voltage with a reference voltage corresponding to the net voltage of the oscillator operating in a nominal condition of zero net magnetic field.

12. The magnetometer of claim 11, wherein the voltage corresponding to the detected oscillator asymmetry is integrated over time.

13. The magnetometer of claim 12, wherein the integrated, detected oscillator asymmetry is compared to a reference triangular waveform synchronous with the oscillator signal, to produce a pulse-width modulated (PWM) signal possessing a pulse-duty determined by the difference in the net voltage between the integrated detected oscillator asymmetry, and the reference triangle waveform.

14. The magnetometer of claim 13, wherein this PWM signal is amplified using said switching means.

15. The magnetometer of claim 14, wherein the amplified PWM signal is low-pass filtered, and its output, a steady state current, is summed with current of the saturable core flux-gate inductor, wherein this current serves to close a negative feedback loop, thereby forcing the net magnetic field within the flux-gate inductor cores to become nominally zero.

16. The magnetometer of claim 15, wherein the feedback loop means, the net amplitude and polarity of the feedback current, are directly and linearly related to the amplitude and direction of the external magnetic field applied to the saturable core flux-gate inductor.

17. The magnetometer of claim 16, wherein the PWM signal is low-pass filtered to yield a signal proportional to the external magnetic field.

18. The magnetometer of claim 17, wherein measurement of torque is achieved by positioning the saturable core flux-gate inductor in proximity to a circumferentially magnetized torque-bearing shaft of magnetoelastically active material.

19. The magnetometer of claim 9, further comprising:

a shunt resistor connected in series between the output of the saturable core flux-gate inductor and the capacitor.

* * * * *